United States Patent
Jang

(10) Patent No.: US 10,101,400 B2
(45) Date of Patent: Oct. 16, 2018

(54) CONTROL METHOD AND SYSTEM OF BREAKDOWN DIAGNOSIS

(71) Applicant: Hyundai Motor Company, Seoul (KR)

(72) Inventor: Hwa Yong Jang, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 282 days.

(21) Appl. No.: 14/879,118

(22) Filed: Oct. 9, 2015

(65) Prior Publication Data

US 2016/0370434 A1    Dec. 22, 2016

(30) Foreign Application Priority Data

Jun. 16, 2015  (KR) .......................... 10-2015-0085416

(51) Int. Cl.
 *G01R 31/00* (2006.01)
 *G01R 31/36* (2006.01)
 *B60Q 9/00* (2006.01)

(52) U.S. Cl.
 CPC .......... *G01R 31/3651* (2013.01); *B60Q 9/00* (2013.01); *G01R 31/007* (2013.01)

(58) Field of Classification Search
 None
 See application file for complete search history.

(56) References Cited

U.S. PATENT DOCUMENTS

| 9,236,735 | B2 * | 1/2016 | Yoo | ............................ | H02J 1/10 |
| 2008/0086247 | A1 * | 4/2008 | Gu | ........................ | H02J 7/0022 |
| | | | | | 701/36 |
| 2012/0256488 | A1 * | 10/2012 | Linn | .................... | B60L 11/1861 |
| | | | | | 307/43 |
| 2014/0229753 | A1 * | 8/2014 | Itou | ........................ | G06F 1/3209 |
| | | | | | 713/323 |
| 2016/0190830 | A1 * | 6/2016 | Kuhlmann | ............ | H02J 7/0026 |
| | | | | | 320/116 |

FOREIGN PATENT DOCUMENTS

| JP | 2003-158782 A | 5/2003 |
| JP | 2013-220705 A | 10/2013 |
| JP | 2014-084082 A | 5/2014 |
| JP | 5867605 B2 | 2/2016 |
| KR | 10-2010-0115965 | 10/2010 |
| KR | 10-2013-0064381 A | 6/2013 |

* cited by examiner

*Primary Examiner* — Jonathan M Dager
(74) *Attorney, Agent, or Firm* — Mintz Levin Cohn Ferris Glovsky and Popeo, P.C.; Peter F. Corless

(57) ABSTRACT

A method and system for controlling breakdown diagnosis are provided. The method includes sensing voltage values of respective batteries applied to a master and a slave via communication between the master and the slave. Additionally, a breakdown diagnosis logic is halted when the sensed battery voltage of the slave is less than a predetermined reference.

18 Claims, 2 Drawing Sheets

CONTROL METHOD AND SYSTEM OF BREAKDOWN DIAGNOSIS

CROSS REFERENCE TO RELATED APPLICATION(S)

This application claims the benefit of Korean Patent Application No. 10-2015-0085416, filed on Jun. 16, 2015, which is hereby incorporated by reference in its entirety into this application.

BACKGROUND

1. Field of the Invention

The present invention relates to a method and system for controlling breakdown diagnosis by which the generation of a breakdown code is prevented for a component that is not malfunctioning wherein the generation, in spite of a low voltage state of a motor vehicle, is due to the inability to recognize the voltage drop.

2. Description of the Related Art

Control systems for vehicles have been manufactured to include a self-diagnosis unit that provides a driver with information regarding a vehicle status, inspected information, or abnormal or normal states. Further, with the advancement of telematics, methods have been developed for providing drivers with information regarding vehicle repair centers or regarding long-distance repair centers of a vehicle's abnormal state.

In particular, a control system for vehicles includes various units such as an in-panel module (IPM), a driver door module (DDM), and an ADM (Assist Door Module). The IPM is configured to inspect and display controlled states of wipers, seat belt alarms, rear-glass heating wires, vehicle burglar alarms, automatic turn-off of vehicle side lamps, a key-hole lamp, and other lamps of the vehicle. The DDM is configured to control door lock and unlock states, power windows of the driver's seat door and other doors, and a side mirror and a puddle lamp of the driver's seat door. The ADM covers controlling states of power windows, a side mirror and a puddle lamp of passenger seat doors. Further, clusters are provided to detect vehicle speeds, and states of the RPM instrument panel, the engine, door opening, and seat belts, and to display the inspected results, together with warnings when necessary.

In addition, a vehicle is equipped with a power seat module (PSM) configured to set a driver's seat using a manual switch, and automatically memorize and restore driver's seat positions, a steering column module (SCM) configured to set a steering wheel using a manual switch, and automatically memorize and restore the positions set for the steering wheel, a smart key (SMK) configured to lock and unlock vehicle doors and start a vehicle using a key fob, and a power distribution module (PDM) configured to control voltage states of a battery as an electricity source for all components and voltage states for ACC (Accessory)/IGN (Ignition) and engine start.

Furthermore, the various units mounted within a vehicle are operated by an electronic control unit (ECU). The ECU and the units receive operating power from a battery mounted within the vehicle, and diagnose components using an internal algorithm while receiving data sensors for the components via a controller area network (CAN).

However, the use of CAN alone may be problematic in that when a battery voltage is gradually reduced due to, for example, the long-term negligence of a motor vehicle, excessive consumption of dark currents, etc., a breakdown code may be generated even though no breakdowns have actually occurred in the units the controller and the units do not recognize the gradual decrease of the voltage in advance. In other words, no problems occur when voltage consumption of a vehicle is inspected on a typical level, but a gradual decrease in voltage may be apt to cause miss-generation of breakdown codes in spite of no breakdowns.

There is therefore a need for a method for controlling breakdown diagnosis by which false sensing leading to the generation of breakdown codes for units that are not out of order (e.g., no failure) may be prevented wherein when a motor vehicle undergoes a gradually decrease in voltage due to long-term negligence of the motor vehicle or excessive consumption of dark currents, the generation is due to the inability of a master (e.g., a controller) to recognize the voltage drop.

The matters described as the background arts are merely intended to increase the understanding of the background of the present invention, but should not be recognized as being prior arts which are already known to those skilled in the art.

SUMMARY

Accordingly, the present invention provides a method and system for controlling breakdown diagnosis by which false sensing leading to the generation of breakdown codes for units that are not out of order may be prevented after a motor vehicle is gradually decreased in voltage due to long-term negligence of the motor vehicle or excessive consumption of dark currents wherein the generation is due to the master not detecting the voltage decrease.

In one aspect, the present invention provides a method for controlling breakdown diagnosis that may include: sensing voltage values of respective batteries applied to a master (e.g., a controller) and a slave (e.g., a unit) via communication between the master and the slave; and halting a breakdown diagnosis when the sensed battery voltage of the slave is less than a predetermined reference.

In the voltage sensing process, the master may be configured to detect a voltage value applied thereto and transmit the voltage value to the slave while requesting the slave to detect a voltage value applied thereto and to transmit the voltage value to the master. In addition, in response to receiving the request message from the master, the slave may be configured to detect the voltage value applied thereto and transmit the detected voltage value to the master. Further, voltage states of the batteries may be detected while the master and the slave transmit and receive to each other respectively detected voltage values in real time.

In the voltage sensing process, voltage values may be transmitted and received between the master and the slave via local interconnect network (LIN) communication. Additionally, voltage values of the master and the slave may be detected repetitively until the voltage values reach the reference values input into the master. The communication in the voltage sensing process may be executed between one master and a plurality of slaves.

In the breakdown diagnosis-halting process, when the sensed battery voltage of the slave is less than a predetermined reference input into the master, a breakdown diagnosis logic may not be performed (e.g., normal operation continues). Further, when the sensed battery voltage of the slave is less than a predetermined reference input into the master, a breakdown diagnosis logic corresponding to the voltage value may not be performed in the breakdown diagnosis halting process.

According to another exemplary embodiment, the method may further include terminating the voltage sensing when the sensed battery voltage of the slave is less than a predetermined minimum reference input into the master. The termination process may further include outputting a warning to driver regarding the battery having a residual voltage capacity less than the minimum voltage required for vehicle operation.

According to another exemplary embodiment, the breakdown diagnosis halting process may be set in such a way that, when the sensed voltage value is maintained to be equal to or higher greater a previously sensed voltage value for a predetermined period of time input into the master, the halting of the breakdown diagnosis logic corresponding to the currently sensed voltage value may be removed.

According to the method for controlling breakdown diagnosis, battery voltage values detected in individual slaves may be sensed via LIN communication between the master and the slaves, and transmitted as a message to the master, whereby breakdown sensing logic may or may not be performed on individual slaves based on the breakdown diagnosis prohibiting level by item/battery voltage. Thus, the method for controlling breakdown diagnosis in accordance with the present invention may prevent the generation of breakdown codes attributable to a gradual voltage decrease, such as in long-term negligence of motor vehicles, excessive consumption of dark currents, etc., but is not attributable to real breakdown of vehicle components, thereby improving the driving quality of motor vehicles.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Figure 1:
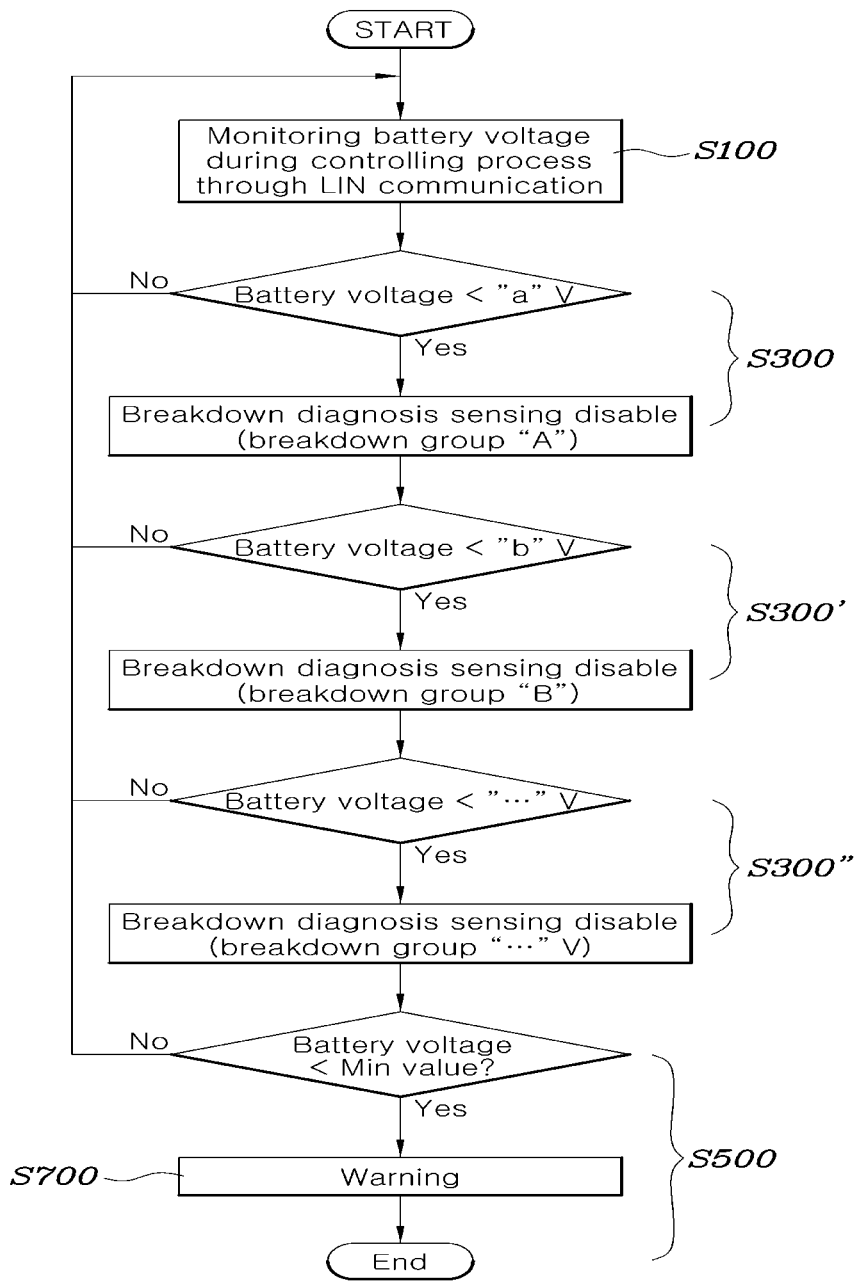
FIG. 1 is a flow chart illustrating a method for controlling breakdown diagnosis in accordance with an exemplary embodiment of the present invention.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, combustion, plug-in hybrid electric vehicles, hydrogen-powered vehicles and other alternative fuel vehicles (e.g. fuels derived from resources other than petroleum).

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Reference now should be made to the drawings, in which the same reference numerals are used throughout the different drawings to designate the same or similar components. Further, the method as described herein below will be understood to be executed by a controller having a processor and a memory.

Figure 2:
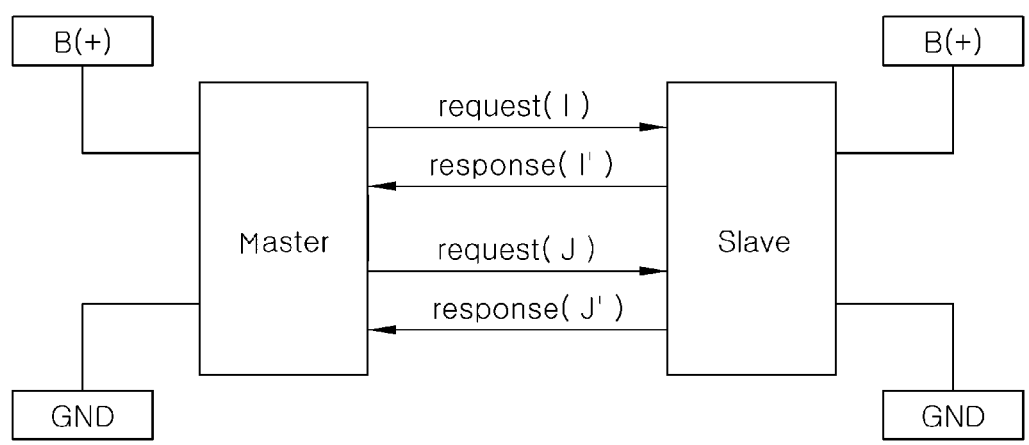
FIG. 2 is a block diagram illustrating a structure designed to implement the method of FIG. 1 in accordance with an exemplary embodiment of the present invention.

FIG. 1 is a flow chart illustrating a method for controlling breakdown diagnosis in accordance with an exemplary embodiment of the present invention while FIG. 2 is a block diagram illustrating a structure designed to implement the method of FIG. 1. In accordance with an exemplary embodiment of the present invention, the method for controlling breakdown diagnosis may include a voltage sensing process (S100) in which voltage values of respective batteries (B) applied to a master and a slave may be sensed by communication between the master and the slave; and a breakdown diagnosis-halting process (S300) in which when the sensed battery voltage (B) of the slave is less than a predetermined reference, a breakdown diagnosis logic may not be performed. In other words, a breakdown diagnosis logic may be performed when the sensed battery voltage (B) of the slave is equal to or greater than the predetermined reference.

Once a motor vehicle starts to be operated, the voltage sensing step (S100) may be executed by a controller, using various sensors, to sense voltage values of respective batteries (B) applied to a master and a slave via communication between the master and the slave. In particular, communication may be conducted between one master and a plurality of slaves. Likewise, the fulfillment of the breakdown diagnosis may be halted or prevented simultaneously between the master and the multiple slaves in the breakdown diagnosis-halting process (S300), or selectively between the master and a part of the slaves. Additionally, a master may be configured to detect a voltage value applied thereto and transmit the voltage value to a slave while requesting the slave to detect a voltage value applied thereto and to transmit the voltage value to the master. In response to receiving the request message from the master, the slave may be configured to detect the voltage value applied thereto and transmit the detected voltage value to the master.

In the voltage sensing process (S100), voltage states of the batteries (B) may be detected while the master and the slave transmit and receive to each other respectively detected voltage values in real time. Thus, the master may be configured to sense a gradual decrease in battery voltage (B), to thus generate a breakdown diagnosis code for a slave breakdown, but may not generate a breakdown diagnosis code due to a low voltage during the performance of a breakdown diagnosis logic. Therefore, the false breakdown sensing attributed to a low voltage of the battery (B), but not to the breakdown of a component may be avoided in the present invention.

Furthermore, in the voltage sensing process (S100), voltage values may be exchanged between the master and the slave via LIN communication. Specifically, LIN is an inexpensive serial network protocol used for communication between components within vehicles, and may be used together with a typical controller area network (CAN) protocol. Since differential signals with which CAN is familiar are not transmitted in the present invention, a power source for the master may be used as a predetermined reference voltage for bus level, together with a ground (GND), to ensure noise resistance. Additionally, LIN communication features single-wire communication up to about 20 kbps, which is slower than other communications. However, LIN communication through which a master may communicate with a slave in real time allows voltage values of batteries detected in individual slaves to be continually monitored in real time and to be reflected into the communication messages between the master and the individual slaves. The messages may be shared among the slaves, units, or nodes and the performance of breakdown diagnosis logic may be halted or terminated when the message corresponds to a prohibition level of breakdown detection defined according to breakdown diagnosis item/battery voltage (B) in each slave, thereby preventing false sensing.

As described above, when voltage values are transmitted between the master and the slaves via LIN in the voltage sensing process (S100), the detected voltage values may be compared with a predetermined reference pre-input (e.g., previously input) to the master. When the detected voltage values are less than the reference value, breakdown diagnosis logics that correspond to the voltage values may not be performed in the breakdown diagnosis halting process (S300). Correspondingly, when the detected voltage vales are equal to or greater than the reference value, breakdown diagnosis logics that correspond to the voltage values may be performed.

Further, in the breakdown diagnosis halting process (S300), particularly, multiple voltage ranges may be set, and the breakdown diagnosis logic corresponding to a detected voltage value may be disabled when the detected voltage is less than a reference value by voltage range, as shown in FIG. 1 where reference values are represented by letters a, b, . . . , etc., and may be set in a stepwise manner based on vehicle conditions or environments. Breakdown diagnosis logic may be not performed on breakdown groups (A, B, . . . ) corresponding to voltages falling within the preset ranges. Typically, breakdown diagnosis logic may be performed in an On-Board Diagnostics 1 (OBD1) mode for direct breakdown of components and in an OBD2 mode for comprehensive conditions such as vehicle behaviors. The breakdown diagnosis logic may not be performed in its entirety for both the two modes, but differentially in a stepwise manner based on mode or slave.

Additionally, a battery voltage (B) at which a motor vehicle may normally operate may typically be about 9 V or greater. In the voltage sensing process (S100) and the breakdown diagnosis halting process (S300), the breakdown diagnosis logic may not be executed while voltage values of the master and the slave are detected repetitively until they reach the reference values (a, b, . . . ) input into the master. When a voltage detected in the voltage sensing process (S100) is less than the minimum reference input into the master, the battery (B) may be determined as unavailable and a termination process (S500) may be executed to terminate the voltage sensing process (S100).

In another exemplary embodiment of the present invention, the termination process (S500) may further include a warning process (S700) in which a warning may be output to a driver regarding the battery (B) having residual voltage capacity less than the minimum voltage required for vehicle operation. The voltage sensing process (S100) and the breakdown diagnosis-halting process (S300) may be paired, as shown in FIG. 1, to subdivide references for voltage values of the battery (B) gradually and differentially. The master and the slave may be individually monitored for their respective voltage values during which when the sensed voltage value is less than the reference for the master, the corresponding breakdown diagnosis logic may be halted. Accordingly, the voltage sensing process S100 and the breakdown diagnosis halting process S300 may be repeated in combination. When the sensed voltage value is greater than the reference, the voltage values between the master and the slave may be compared to the initial reference (a). Similarly, when the voltage of the battery (B) is within the predetermined range, the voltage sensing process (S100) and the breakdown diagnosis-halting process (S300) may be repeated infinitely.

In addition, the breakdown diagnosis halting process (S300) may be set in such a way that, when the voltage value sensed in the voltage sensing process (S100) is maintained as being a previously sensed voltage value or greater for a predetermined period of time input into the master, the halting of the breakdown diagnosis logic corresponding to the currently sensed voltage value may be removed, and thus the breakdown diagnosis may restart. Particularly, the condition and time may be predetermined upon vehicle design and input as default values into the master.

According to the method for controlling breakdown diagnosis, battery voltages values detected in individual slaves may be sensed via LIN communication between the master and the slaves, and transmitted as a message to the master, whereby breakdown sensing logic may or may not be performed on individual slaves based on the breakdown diagnosis prohibiting level by item/battery voltage. Hence, the method for controlling breakdown diagnosis in accordance with the present invention may prevent the generation of breakdown codes attributable to a gradual voltage decrease, such as in the long-term negligence of a motor vehicle, excessive consumption of dark currents, etc., but not attributable to real breakdown of vehicle components, thereby improving the driving quality of motor vehicles.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for controlling breakdown diagnosis, comprising:
   sensing, by a master and a slave, voltage values of respective batteries applied to the master and the slave via communication between the master and the slave;
   halting, by the master and the slave, a breakdown diagnosis logic when the sensed battery voltage of the slave is less than a predetermined reference;
   terminating, by the master and the slave, the sensing of the voltage values when the sensed battery voltage of the slave is less than a predetermined minimum reference input into the master; and
   outputting, by the master, a warning to a driver regarding the battery having a residual voltage capacity less than the minimum voltage required for vehicle operation.

2. The method of claim 1, wherein the master is configured to detect a voltage value applied thereto and transmit the voltage value to the slave while requesting the slave to detect a voltage value applied thereto and to transmit the voltage value to the master in the sensing of the voltage values.

3. The method of claim 2, wherein in response to receiving the request message from the master, the slave is configured to detect the voltage value applied thereto and transmit the detected voltage value to the master.

4. The method of claim 1, wherein voltage states of the batteries are detected while the master and the slave transmit and receive to each other respectively detected voltage values in real time.

5. The method of claim 1, wherein voltage values are transmitted and received between the master and the slave via a local interconnect network (LIN) communication.

6. The method of claim 1, wherein voltage values of the master and the slave are detected repetitively until the voltage values reach the reference value input into the master.

7. The method of claim 1, wherein the communication is executed between one master and a plurality of slaves.

8. The method of claim 1, wherein when the sensed battery voltage of the slave is less than a predetermined reference input into the master, the breakdown diagnosis logic is halted.

9. The method of claim 1, wherein when the sensed battery voltage of the slave is less than a predetermined reference input into the master, a breakdown diagnosis logic corresponding to the voltage value is halted.

10. The method of claim 1, when the sensed voltage value is maintained as equal to or greater than a previously sensed voltage value for a predetermined period of time input into the master, the halting of the breakdown diagnosis logic corresponding to the currently sensed voltage value is removed.

11. A system for controlling breakdown diagnosis, comprising:
    a memory configured to store program instructions; and
    a master and a slave configured to execute the program instructions, the program instructions when executed configured to:
       sense voltage values of respective batteries applied to the master and the slave via communication between the master and the slave; and
       halt a breakdown diagnosis logic when the sensed battery voltage of the slave is less than a predetermined reference;
       terminate the sensing of the voltage values when the sensed battery voltage of the slave is less than a predetermined minimum reference input into the master; and
       output by the master a warning to a driver regarding the battery having a residual voltage capacity less than the minimum voltage required for vehicle operation.

12. The system of claim 11, wherein voltage states of the batteries are detected while the master and the slave transmit and receive to each other respectively detected voltage values in real time.

13. The system of claim 11, wherein when the sensed battery voltage of the slave is less than a predetermined reference input into the master, the breakdown diagnosis logic is halted.

14. The system of claim 11, wherein when the sensed battery voltage of the slave is less than a predetermined reference input into the master, a breakdown diagnosis logic corresponding to the voltage value is halted.

15. The system of claim 11, wherein the program instructions when executed are further configured to:
    terminate the sensing of the voltage values when the sensed battery voltage of the slave is less than a predetermined minimum reference input into the master.

16. A non-transitory computer readable medium containing program instructions executed by a master and a slave, the computer readable medium comprising:
    program instructions that sense voltage values of respective batteries applied to the master and the slave via communication between the master and the slave; and
    program instructions that halt a breakdown diagnosis logic when the sensed battery voltage of the slave is less than a predetermined reference,
    wherein the master and the slave terminate the sensing of the voltage values when the sensed battery voltage of the slave is less than a predetermined minimum reference input into the master, and
    wherein the master outputs a warning to a driver regarding the battery having a residual voltage capacity less than the minimum voltage required for vehicle operation.

17. The non-transitory computer readable medium of claim 16, wherein when the sensed battery voltage of the slave is less than a predetermined reference input into the master, the breakdown diagnosis logic is halted.

18. The non-transitory computer readable medium of claim 16, wherein when the sensed battery voltage of the slave is less than a predetermined reference input into the master, a breakdown diagnosis logic corresponding to the voltage value is halted.

* * * * *